US012551982B2

(12) United States Patent
Kwon et al.

(10) Patent No.: US 12,551,982 B2
(45) Date of Patent: Feb. 17, 2026

(54) POLISHING PAD AND SUBSTRATE PROCESSING APPARATUS INCLUDING THE SAME

(71) Applicant: SAMSUNG ELECTRONICS CO., LTD., Suwon-si (KR)

(72) Inventors: Donghoon Kwon, Suwon-si (KR); Boun Yoon, Suwon-si (KR); Kihoon Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 347 days.

(21) Appl. No.: 18/100,937

(22) Filed: Jan. 24, 2023

(65) Prior Publication Data

US 2023/0381913 A1 Nov. 30, 2023

(30) Foreign Application Priority Data

May 30, 2022 (KR) ........................ 10-2022-0066352

(51) Int. Cl.

*B24B 37/015* (2012.01)
*B24B 37/04* (2012.01)
*H01L 21/321* (2006.01)

(52) U.S. Cl.

CPC .......... *B24B 37/015* (2013.01); *B24B 37/042* (2013.01); *H01L 21/3212* (2013.01)

(58) Field of Classification Search

None

See application file for complete search history.

(56) References Cited

U.S. PATENT DOCUMENTS

| | | | | | |
|---|---|---|---|---|---|
| 5,609,517 | A * | 3/1997 | Lofaro | B24B 37/22 451/529 |
| 6,620,336 | B2 * | 9/2003 | Nakamura | B24B 37/20 438/692 |
| 7,029,365 | B2 * | 4/2006 | Chang | C25D 17/10 205/672 |
| 7,695,597 | B1 * | 4/2010 | Drewery | C25F 7/00 204/194 |
| 7,762,870 | B2 | 7/2010 | Ono et al. | |
| 8,944,888 | B2 | 2/2015 | Kubo et al. | |
| 9,421,666 | B2 | 8/2016 | Krishnan et al. | |
| 10,195,713 | B2 | 2/2019 | Norimoto | |
| 10,593,574 | B2 | 3/2020 | Fung et al. | |

(Continued)

FOREIGN PATENT DOCUMENTS

| | | | | |
|---|---|---|---|---|
| JP | 2001-269862 A | 10/2001 | | |
| KR | 10-2013-0138841 A | 12/2013 | | |
| WO | WO-2012162066 A1 * | 11/2012 | | B24B 37/20 |

OTHER PUBLICATIONS

Communication issued Nov. 15, 2025 by the Korean Intellectual Property Office in Korean Patent Application No. 10-2022-0066352.

*Primary Examiner* — Sylvia MacArthur
(74) *Attorney, Agent, or Firm* — Sughrue Mion, PLLC

(57) ABSTRACT

A substrate processing apparatus includes a polishing platen including a fluid channel, a polishing pad provided on a first surface of the polishing platen, the polishing pad including a pad body including a trench and a thermal conductive body provided in the trench of the pad body and connected to the first surface of the polishing platen, and a polishing head provided on the polishing pad and configured to support a substrate.

18 Claims, 14 Drawing Sheets

(56) References Cited

U.S. PATENT DOCUMENTS

| | | | |
|---|---|---|---|
| 10,919,123 B2 | 2/2021 | Hariharan et al. | |
| 11,154,959 B2 | 10/2021 | Lehuu et al. | |
| 2020/0331119 A1 | 10/2020 | Valentini | |
| 2023/0381913 A1* | 11/2023 | Kwon | B24B 37/042 |

* cited by examiner

POLISHING PAD AND SUBSTRATE PROCESSING APPARATUS INCLUDING THE SAME

CROSS-REFERENCE TO RELATED APPLICATION

This application is based on and claims priority to Korean Patent Application No. 10-2022-0066352, filed on May 30, 2022, in the Korean Intellectual Property Office, the disclosure of which is incorporated herein by reference in its entirety.

BACKGROUND

1. Field

Example embodiments of the disclosure relate to a polishing pad and a substrate processing apparatus including the polishing pad.

2. Description of Related Art

When the semiconductor device is manufactured, a polishing process, for example, a chemical mechanical polishing (CMP) process, may be performed on a substrate, such as a wafer. In general, the polishing process includes rubbing the substrate onto the polishing pad to flatten the surface of the substrate or the surface of a material film on the substrate. Recently, research has been conducted to improve the efficiency of a polishing process by decreasing or increasing the temperature of the polishing pad to a target temperature before or during polishing of the substrate.

In a related art method of controlling the temperature of a polishing pad by controlling the temperature of a polishing platen, it is difficult to control the temperature of the polishing pad because the polishing pad acts as a thermal insulating material.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide are a polishing pad and a substrate processing apparatus including the polishing pad.

Additional aspects will be set forth in part in the description which follows and, in part, will be apparent from the description, or may be learned by practice of the presented embodiments.

According to an aspect of an example embodiment, a substrate processing apparatus may include a polishing platen including a fluid channel, a polishing pad provided on a first surface of the polishing platen, the polishing pad including a pad body including a trench and a thermal conductive body provided in the trench of the pad body and connected to the first surface of the polishing platen, and a polishing head provided on the polishing pad and configured to support a substrate.

According to an aspect of an example embodiment, a polishing pad may include a pad body including a lower surface, an upper surface opposite to the lower surface, and a trench extending from the lower surface of the pad body to the upper surface of pad body, and a thermal conductive body provided in the trench of the pad body and exposed through the lower surface of the pad body.

According to an aspect of an example embodiment, a substrate processing method may include preparing a polishing pad, arranging the polishing pad on a polishing platen, and polishing a substrate by rubbing the substrate with the polishing pad, where the preparing of the polishing pad includes forming a first layer including a lower pad body and a thermal conductive body, forming a second layer including an upper pad body on the lower pad body and a sacrificial body on the thermal conductive body, and removing the sacrificial body such that an upper surface of the thermal conductive body is exposed.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
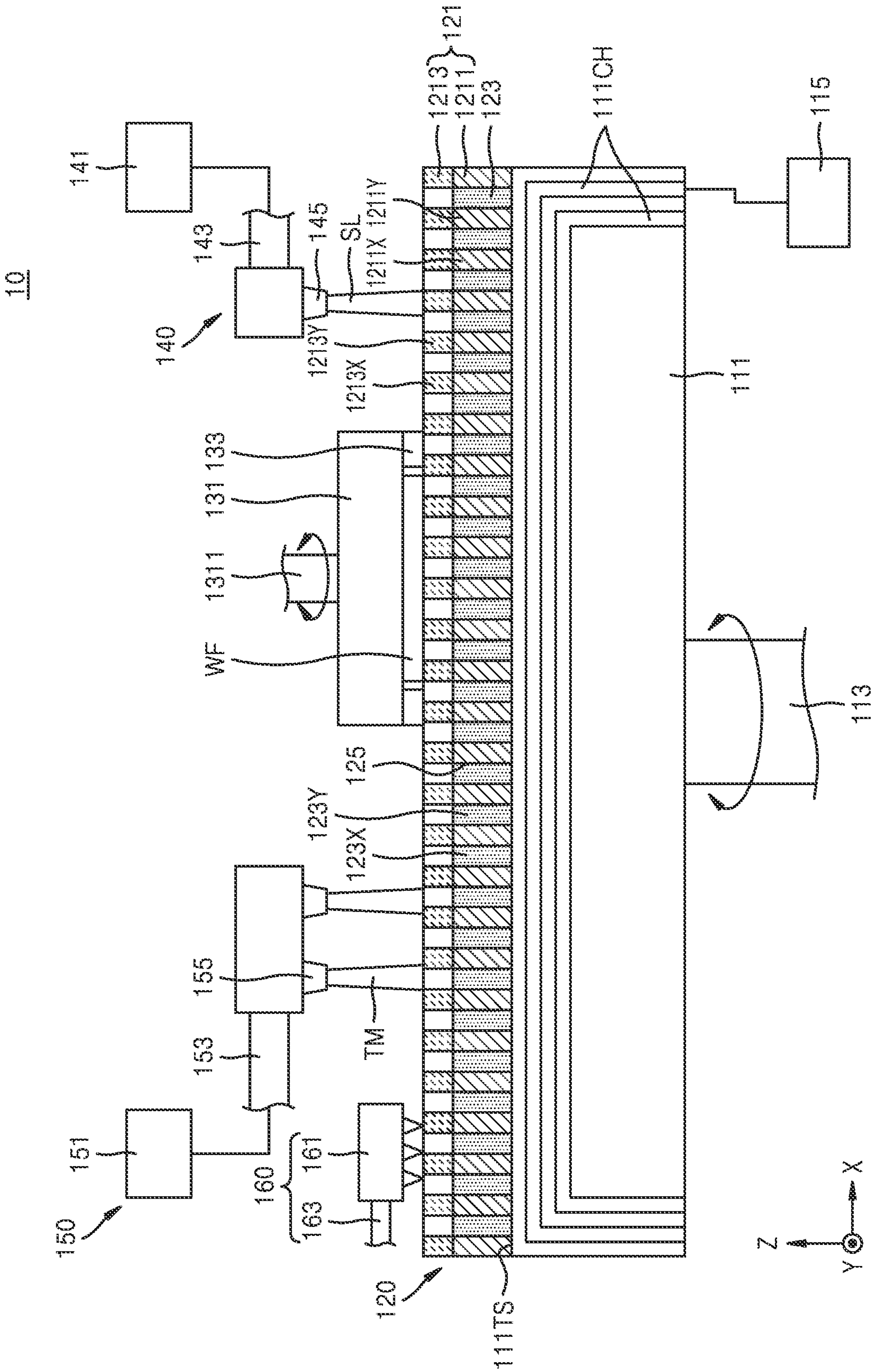
FIG. 1 is a cross-sectional view illustrating a substrate processing apparatus according to example embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
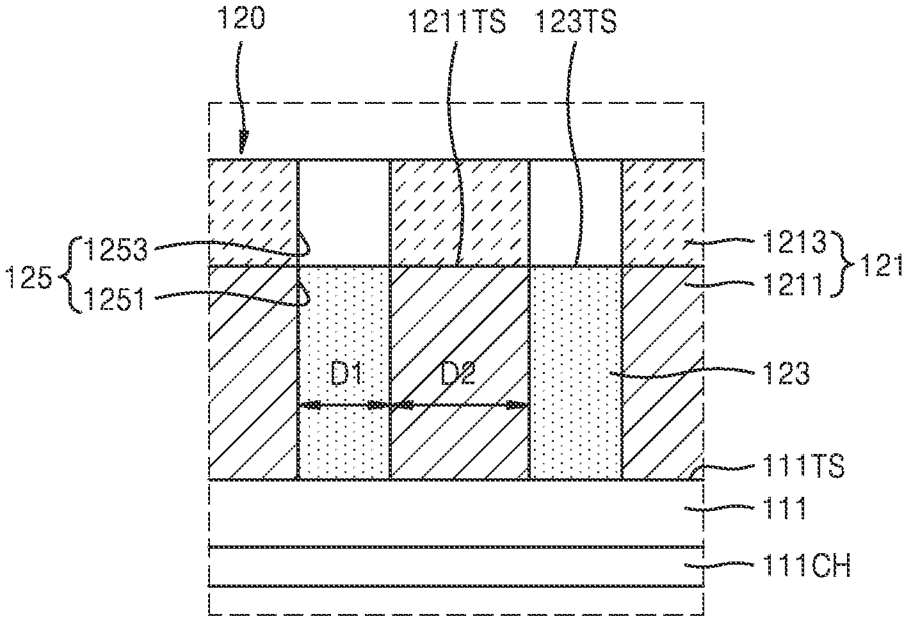
FIG. 2 is a cross-sectional view illustrating a partial area of the substrate processing apparatus of FIG. 1 according to example embodiments.
Figure 3:
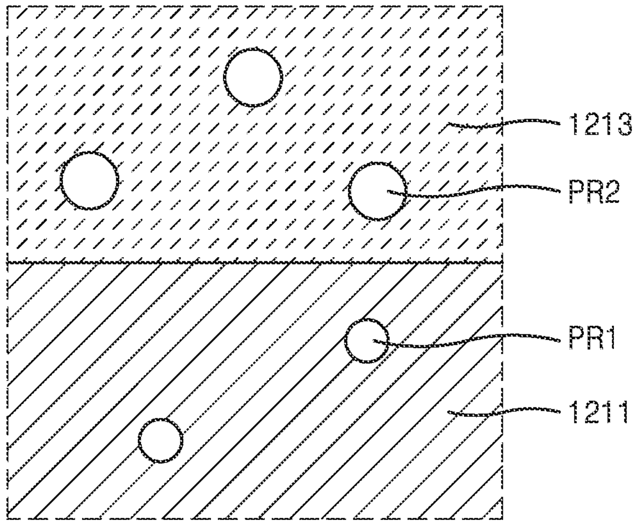
FIG. 3 is a cross-sectional view illustrating a partial area of a polishing pad according to example embodiments.

FIG. 1 is a cross-sectional view illustrating a substrate processing apparatus 10 according to example embodiments. FIG. 2 is a cross-sectional view illustrating a partial area of the substrate processing apparatus 10 of FIG. 1 according to example embodiments. FIG. 3 is a cross-sectional view illustrating a partial area of a polishing pad 120 according to example embodiments.

Referring to FIGS. 1 to 3, the substrate processing apparatus 10 may include a polishing platen 111, the polishing pad 120, a polishing head 131, a slurry supply device 140, a medium supply device 150, and a pad conditioning device 160.

The substrate processing apparatus 10 may be configured to perform a polishing process on a substrate WF, for example, a chemical mechanical polishing process. The substrate WF may refer to the substrate WF itself, or a laminated structure including the substrate WF and a material layer formed on the surfaces of the substrate WF. In addition, the term "surface of the substrate WF" may refer to the surface of the substrate WF itself, or the surface of the material layer formed on the substrate WF.

The polishing platen 111 may have a plate shape. For example, the polishing platen 111 may have a circular plate shape. For example, the polishing platen 111 may include a metal. An upper surface 111TS of the polishing platen 111, on which the polishing pad 120 is placed, may be flat. Hereinafter, a horizontal direction (e.g., the X direction and/or the Y direction) may be defined as a direction parallel to the upper surface 111TS of the polishing platen 111, a vertical direction (e.g., the Z direction) may be defined as a direction perpendicular to the upper surface 111TS of the polishing platen 111, and a horizontal width may be defined as a length along the horizontal direction (e.g., the X direction and/or the Y direction).

The polishing platen 111 may be a rotation table configured to rotate with respect to a rotation axis parallel to a vertical direction (e.g., the Z direction). The polishing platen 111 may be connected to a platen driving shaft 113 configured to be rotated by an actuator, such as a rotary motor, etc., and may be configured to be rotated by the platen driving shaft 113.

The polishing platen 111 may include one or more fluid channels 111CH configured to allow a temperature control fluid to flow therein. At least a portion of the fluid channel 111CH may extend within a region close to the upper surface 111TS of the polishing platen 111. For example, at least a part of the fluid channel 111CH may extend in a direction (e.g., the X direction and/or the Y direction) parallel to the upper surface 111TS of the polishing platen 111 in a region close to the upper surface 111TS of the polishing platen 111. The fluid channel 111CH may be configured to receive a temperature control fluid (e.g., a cooling fluid or a heating fluid) from a fluid supply device 115. The fluid supply device 115 may be configured to heat or cool the temperature control fluid to have a predetermined temperature, and to supply the temperature control fluid having a predetermined temperature to the fluid channel 111CH. The fluid supply device 115 may include a fluid source in which the temperature control fluid is stored, a heating device configured to heat the temperature control fluid, a cooling device configured to cool the temperature control fluid, and a pump. For example, the temperature control fluid may include water, ethylene glycol, silicone oil, liquid Teflon, or a mixture thereof. As the temperature control fluid flows through the fluid channel 111CH of the polishing platen 111, the temperature of the polishing platen 111 and the temperature of the polishing pad 120 arranged on the polishing platen 111 may be adjusted. For example, as the heating fluid is supplied to the fluid channel 111CH of the polishing platen 111, the temperature of the polishing platen 111 and the temperature of the polishing pad 120 may increase to a target temperature. For example, as the cooling fluid is supplied to the fluid channel 111CH of the polishing platen 111, the temperature of the polishing platen 111 and the temperature of the polishing pad 120 may decrease to a target temperature. The temperature control of the polishing platen 111 by using the temperature control fluid may be performed to provide a temperature condition suitable for the polishing process of the substrate WF.

The polishing pad 120 may be arranged on the upper surface 111TS of the polishing platen 111. The polishing pad 120 may contact the upper surface 111TS of the polishing platen 111 and may at least partially cover the upper surface 111TS of the polishing platen 111. The polishing pad 120 may be configured to rub the substrate WF to be polished and to polish the substrate WF. For example, the polishing pad 120 may have a thickness of hundreds to thousands of micrometers or so.

In example embodiments, the polishing pad 120 may include a pad body 121 and a thermal conductive body 123.

The pad body 121 may have a plate shape, for example, a circular plate shape. The upper surface and the lower surface of the pad body 121 may be flat, and the upper surface and the lower surface of the pad body 121 may be parallel to the upper surface 111TS of the polishing platen 111, respectively. The pad body 121 may be configured to polish the substrate WF by friction with the substrate WF, and may include, for example, polyurethane. The pad body 121 may include a trench 125. The trench 125 may be defined by a sidewall of the pad body 121. The trench 125 may extend from the lower surface to the upper surface of the pad body 121 to vertically penetrate the pad body 121.

A thermal conductive body 123 may be provided in the trench 125 of the pad body 121 and may contact the upper surface 111TS of the polishing platen 111. The thermal conductivity of the thermal conductive body 123 may be greater than that of the pad body 121. For example, the thermal conductivity of the pad body 121 may be about 1 W/(mK) or less or about 0.1 W/(mK) or less. For example, the pad body 121 may have thermal conductivity at the level of a thermal insulating material. For example, the pad body 121 may be formed of hard polyurethane, and the thermal conductivity of the pad body 121 may be between about 0.01 W/(mK) and about 0.03 W/(mK). The thermal conductivity of the thermal conductive body 123 may be about 100 W/(mK) or more, about 300 W/(mK) or more, or about 500 W/(mK) or more. As the thermal conductive body 123 having relatively high thermal conductivity is provided in the pad body 121, the thermal coupling between the polishing pad 120 and the polishing platen 111 may be further enhanced. As the thermal coupling between the polishing platen 111 and the polishing pad 120 is enhanced, it may be more effectively achieved to provide a temperature condition suitable for the polishing process of the substrate WF through temperature control of the polishing platen 111.

In example embodiments, the thermal conductive body 123 may include a base composed of a polymer and a thermal conductive filler (or thermal conductive particles) contained in the base. The thermal conductive filler may include a carbon-based material, such as carbon nanotubes and graphite, metal particles, such as iron, silver, copper, gold, aluminum, and nickel, and/or ceramic particles, such as aluminum nitride (AlN), boron nitride (BN), silicon carbide (SiC), and beryllium oxide (BeO). In example embodiments, the thermal conductive body 123 may include a thermally conductive polymer. For example, the thermal conductive body 123 may include a polyethylene film having a stacked structure.

The thermal conductive body 123 may partially fill the trench 125 of the pad body 121. The lower surface of the thermal conductive body 123 may contact the upper surface 111TS of the polishing platen 111, and the thermal conductive body 123 may extend upward from the upper surface 111TS of the polishing platen 111. A part of the trench 125 that is not filled with the thermal conductive body 123 may be used as a space in which a fluid (e.g., a polishing slurry SL and/or a temperature control medium TM) used in a polishing process is filled.

As shown in FIG. 1, the thermal conductive body 123 may include a plurality of segments spaced apart from each other, such as segment 123X and segment 123Y. In the cross-section of the polishing pad 120, the horizontal width D1 of the individual segments of the thermal conductive body 123 may be between about 50 μm and about 150 μm or between about 70 μm and about 120 μm. The horizontal width D1 of an individual segment of the thermal conductive body 123 may be substantially the same as the horizontal width of the trench 125 of the pad body 121. In the cross-section of the polishing pad 120, a distance D2 between two neighboring segments among a plurality of segments of the thermal conductive body 123 may be between about 50 μm and about 300 μm or between about 100 μm and about 200 μm.

In example embodiments, the pad body 121 may include a lower pad body 1211 and an upper pad body 1213. The lower pad body 1211 may be arranged on the upper surface 111TS of the polishing platen 111, and the upper pad body 1213 may be arranged on the upper surface 1211TS of the lower pad body 1211. The upper pad body 1213 may vertically overlap the lower pad body 1211, but may not vertically overlap the thermal conductive body 123. In this case, the upper pad body 1213 may function as a polishing layer that rubs against the substrate WF during a polishing process on the substrate WF, and the lower pad body 1211 may function as a support layer for supporting the upper pad body 1213. In example embodiments, the upper pad body 1213 may include a plurality of segments, such as segments 1213X and 1213Y, spaced apart from each other by the trench 125, and the lower pad body 1211 may include a plurality of segments, such as segments 1211X and 1211Y, spaced apart from each other by the thermal conductive body 123 (e.g., by segments of the thermal conductive body 123).

The lower portion 1251 of the trench 125 may be defined by a sidewall of the lower pad body 1211, and the upper portion 1253 of the trench 125 may be defined by a sidewall of the upper pad body 1213. In example embodiments, the thermal conductive body 123 may be configured to fill the lower portion 1251 of the trench 125, and the upper surface 123TS of the thermal conductive body 123 may be coplanar with the upper surface 1211TS of the lower pad body 1211. In this case, the upper portion 1253 of the trench 125 may be provided as an empty space.

In example embodiments, the thermal conductive body 123 may be configured to partially fill the lower portion 1251 of the trench 125, and the upper surface 123TS of the thermal conductive body 123 may be at a lower vertical level than the upper surface 1211TS of the lower pad body 1211. In example embodiments, the thermal conductive body 123 may be formed to partially fill the upper portion 1253 of the trench 125, and the upper surface 123TS of the thermal conductive body 123 may be at a higher vertical level than the upper surface 1211TS of the lower pad body 1211.

The lower pad body 1211 and the upper pad body 1213 may have different hardness properties. In example embodiments, the hardness of the lower pad body 1211 may be greater than the hardness of the upper pad body 1213. For example, the hardness of the lower pad body 1211 may be between about 110% and about 150% of the hardness of the upper pad body 1213. For example, when the shore D hardness of the upper pad body 1213 is approximately 40 to 70, a difference between the shore D hardness of the lower pad body 1211 and the shore D hardness of the upper pad body 1213 may be between about 10 and about 20. As the hardness of the lower pad body 1211 is greater than that of the upper pad body 1213, a force applied to a portion of the upper pad body 1213 (e.g., any one of a plurality of segments of the upper pad body 1213) may be prevented from transferring to another portion (e.g., neighboring segments of the plurality of segments of the upper pad body 1213) of the upper pad body 1213 through the lower pad body 1211 or may be reduced, and thus, during the polishing process on the substrate WF, interference between the plurality of segments of the upper pad body 1213 may be prevented or reduced.

In example embodiments, each of the lower pad body 1211 and the upper pad body 1213 may include a polymer layer having pores. For example, each of the lower pad body 1211 and the upper pad body 1213 may include a polyurethane material layer having pores. The density of the pores PR1 included in the lower pad body 1211 may be less than the density of the pores PR2 included in the upper pad body 1213, and accordingly, the lower pad body 1211 may be configured to have a hardness greater than the upper pad body 1213. The density of pores may be defined by the total volume occupied by pores per unit volume of the lower pad body 1211 or the upper pad body 1213 or the total area occupied by pores per unit area of the lower pad body 1211 or the upper pad body 1213. In example embodiments, as illustrated in FIG. 3, in the cross-section of the polishing pad 120, the total area occupied by the pores PR1 per unit area of the lower pad body 1211 may be less than the total area occupied by the pores PR2 per unit area of the upper pad body 1213. In example embodiments, the average size (e.g., average diameter) of the pores PR1 of the lower pad body 1211 may be less than the average size (e.g., average diameter) of the pores PR2 of the upper pad body 1213.

In example embodiments, the pores PR1 of the lower pad body 1211 may be formed by removing volatile materials included in a raw material of the lower pad body 1211. Similarly, the pores PR2 of the upper pad body 1213 may be formed by removing volatile materials included in a raw material of the upper pad body 1213. For example, the amount (or weight) of the volatile material in the raw material of the lower pad body 1211 may be less than the amount (or weight) of the volatile material in the raw material of the upper pad body 1213, such that the density of the pores PR1 of the lower pad body 1211 may be made smaller than the density of the pores PR2 of the upper pad body 1213.

In example embodiments, the polishing pad 120 may be manufactured through a three dimensional (3D) printing method.

The polishing head 131 may be provided on the polishing pad 120. The polishing head 131 may be configured to hold or support the substrate WF. The substrate WF may be adsorbed and supported on the bottom surface of the polishing head 131 facing the polishing pad 120. In addition, the polishing head 131 may be configured to move horizontally, vertically, and/or rotate by a head driving shaft 1311, which is connected to an actuator. For example, the polishing head 131 may be configured to linearly move in a direction parallel to the upper surface of the polishing pad 120 (e.g., in the X direction and/or the Y direction) or in a direction perpendicular to the upper surface of the polishing pad 120 (e.g., in the Z direction). For example, the polishing head 131 may be configured to rotate with respect to a rotation axis perpendicular to the upper surface of the polishing pad 120 (e.g., the Z direction). In addition, the polishing head 131 may apply an external force acting downward to the substrate WF by the head driving shaft 1311. A retaining ring 133 surrounding a side surface of the substrate WF may be arranged on the bottom surface of the polishing head 131. The retaining ring 133 may support a side portion of the substrate WF so that the substrate WF does not deviate from the polishing head 131.

The slurry supply device 140 may supply the polishing slurry SL to the upper surface of the polishing pad 120. The slurry supply device 140 may include a polishing slurry source 141 in which the polishing slurry SL is stored, a polishing slurry arm 143, and a polishing slurry supply nozzle 145 connected to one end of the polishing slurry arm 143. The polishing slurry SL provided from the polishing slurry source 141 may be provided to the polishing slurry supply nozzle 145 through a flow path, and the polishing slurry supply nozzle 145 may spray the polishing slurry SL to the upper surface of the polishing pad 120. The polishing slurry arm 143 may be configured to pivot with respect to a pivot axis parallel to the vertical direction (e.g., in the Z direction), and may be configured to perform a sweeping operation. The polishing slurry arm 143 may be configured to perform a sweeping operation while the polishing slurry SL is sprayed from the polishing slurry supply nozzle 145.

The polishing slurry SL provided in the slurry supply device 140 may be accommodated in a portion of the trench 125 of the pad body 121 (e.g., the upper portion 1253 of the trench 125). In this case, since the polishing slurry SL accommodated in a part of the trench 125 of the pad body 121 contacts the thermal conductive body 123, the polishing slurry SL may be cooled or heated by the thermal conductive body 123.

The medium supply device 150 may supply the temperature control medium TM to the upper surface of the polishing pad 120. For example, the temperature control medium TM may be a heating medium TM for heating the polishing pad 120 or a cooling medium TM for cooling the polishing pad 120. For example, the medium supply device 150 may increase the temperature of the polishing pad 120 to a target temperature by supplying the heating medium TM heated to a predetermined temperature to the polishing pad 120. For example, the medium supply device 150 may decrease the temperature of the polishing pad 120 to a target temperature by supplying the cooling medium TM cooled to a predetermined temperature to the polishing pad 120. For example, the heating medium TM may include a gas, a liquid, an additive, or a mixture thereof. For example, the gas included in the heating medium TM may include water vapor, heated air, or the like. For example, the liquid included in the heating medium TM may include water, deionized water, etc. For example, the cooling medium TM may include a gas, a liquid, an additive, or a mixture thereof. For example, the gas included in the cooling medium TM may include nitrogen, carbon dioxide, argon, or the like. For example, the liquid included in the cooling medium TM may include water, deionized water, ethanol, isopropyl alcohol, or the like.

The medium supply device 150 may include a medium source 151 in which the temperature control medium TM is stored, a moving arm 153, and a medium supply nozzle 155 connected to one end of the moving arm 153. The temperature control medium TM provided from the medium source 151 may be provided to the medium supply nozzle 155 through a flow passage, and the medium supply nozzle 155 may spray the temperature control medium TM to the upper surface of the polishing pad 120. The moving arm 153 may be configured to pivot with respect to a pivot axis parallel to the vertical direction (e.g., in the Z direction), and may be configured to perform a sweeping operation. The moving arm 153 may be configured to perform a sweeping operation while the temperature control medium TM is sprayed from the medium supply nozzle 155.

The temperature control medium TM provided by the medium supply device 150 may be accommodated in a part of the trench 125 (e.g., an upper portion 1253 of the trench 125) of the pad body 121. In this case, since the temperature control medium TM accommodated in a part of the trench 125 of the pad body 121 contacts the thermal conductive body 123, the polishing slurry SL may be cooled or heated by the thermal conductive body 123.

The pad conditioning device 160 may perform a pad conditioning process of finely cutting the surface of the polishing pad 120. The pad conditioning device 160 may include a conditioning disk 161 and a conditioning arm 163. The conditioning disk 161 may include a cutting tip for finely cutting the surface of the polishing pad 120. The conditioning arm 163 may be connected to the conditioning disk 161 and may move the conditioning disk 161. The conditioning arm 163 may be configured to pivot with respect to a pivot axis parallel to the vertical direction (e.g., in the Z direction), and may be configured to perform a sweeping operation. As the conditioning disk 161 is moved along the surface of the polishing pad 120 and contacts the polishing pad 120, the surface of the polishing pad 120 may be finely cut.

A chemical mechanical polishing process on the substrate WF may be performed in the substrate processing apparatus 10. Specifically, the substrate processing apparatus 10 may be configured to mount the substrate WF on the polishing head 131, have the substrate WF contact the polishing pad 120 with an appropriate pressure using the polishing head 131, polish the substrate WF by moving the substrate WF relative to the polishing pad 120 when the substrate WF contacts the polishing pad 120, and supply the polishing slurry SL to the polishing pad 120. The relative movement of the substrate WF with respect to the polishing pad 120 may be realized by rotation of the polishing platen 111 and/or rotation of the polishing head 131.

In addition, the chemical mechanical polishing process using the substrate processing apparatus 10 may include controlling the temperature of the polishing pad 120. The controlling of the temperature of the polishing pad 120 may include heating the polishing pad 120 and cooling the polishing pad 120. The controlling of the temperature of the polishing pad 120 may include controlling the temperature of the polishing platen 111 by supplying the temperature control fluid to the fluid channel 111CH of the polishing platen 111 and supplying the temperature control medium TM to the polishing pad 120. The controlling of the temperature of the polishing pad 120 may be performed before polishing the substrate WF through contact with the polishing pad 120 and/or while the substrate WF contacts the polishing pad 120 to polish the substrate WF.

According to example embodiments, since the polishing pad 120 includes a thermal conductive body 123 to improve thermal coupling between the polishing pad 120 and the polishing platen 111, temperature control of the polishing pad 120 through temperature control of the polishing platen 111 may be achieved more quickly and effectively. Since temperature control of the polishing pad 120 may be implemented more quickly and effectively, the efficiency and reliability of the polishing process on the substrate WF may be improved.

The substrate processing apparatus 10 may include a controller configured to control the overall process using the substrate processing apparatus 10. The controller may be configured to control operations of components of the substrate processing apparatus 10, for example, the polishing platen 111, the fluid supply device 115, the polishing head 131, the slurry supply device 140, the medium supply device 150, and the pad conditioning device 160. The controller may be implemented in hardware, firmware, software, or any combination thereof. For example, the controller may be a computing device, such as a workstation computer, a desktop computer, a laptop computer, and a tablet computer. For example, the controller may include a memory device, such as a read only memory (ROM) or a random access memory (RAM), and a processor configured to perform predetermined operations and algorithms. The process may include, for example, a microprocessor, a central processing unit (CPU), a graphics processing unit (GPU), etc.

Figure 4:
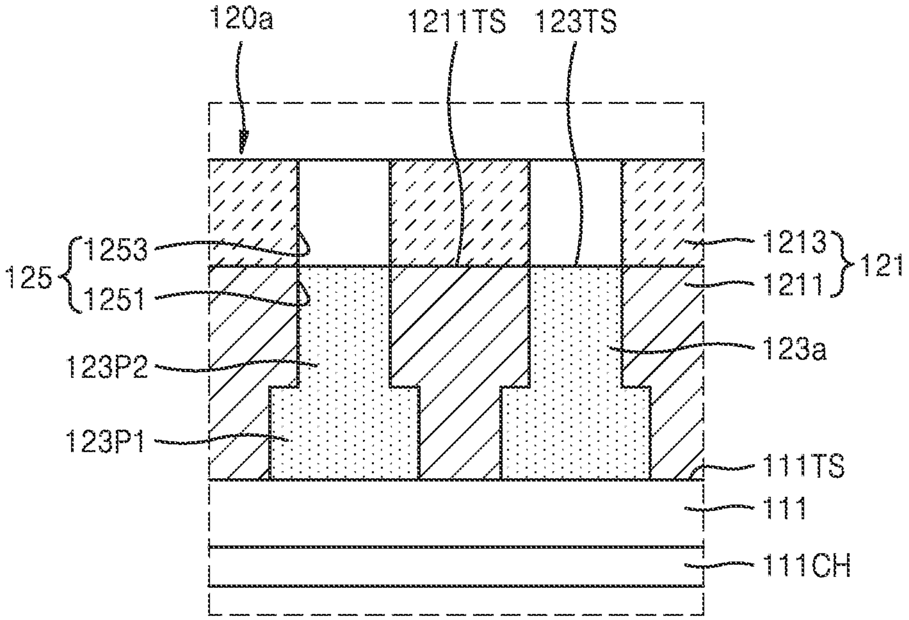
FIG. 4 is a cross-sectional view illustrating a polishing pad according to example embodiments.

FIG. 4 is a cross-sectional view illustrating a polishing pad 120*a* according to example embodiments.

Referring to FIG. 4, a thermal conductive body 123*a* may include a lower portion 123P1 having a relatively large width and an upper portion 123P2 having a relatively small width. The upper portion 123P2 of the thermal conductive body 123*a* may have the same width as the upper portion 1253 of the trench 125. As the contact area between the polishing platen 111 and the thermal conductive body 123*a* increases, the thermal coupling between the polishing platen 111 and the thermal conductive body 123*a* may be improved. In example embodiments, the thermal conductive body 123*a* may have a tapered shape that gradually narrows from the lower portion 123P1 thereof to the upper portion 123P2 thereof.

Figure 5A:
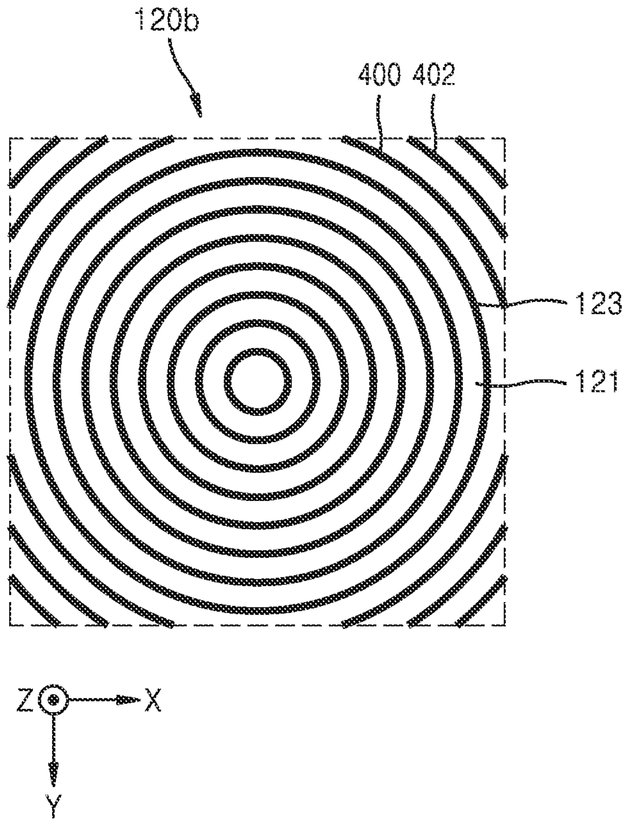
FIGS. 5A, 5B and 5C are diagrams illustrating respective polishing pads according to example embodiments.
Figure 5B:
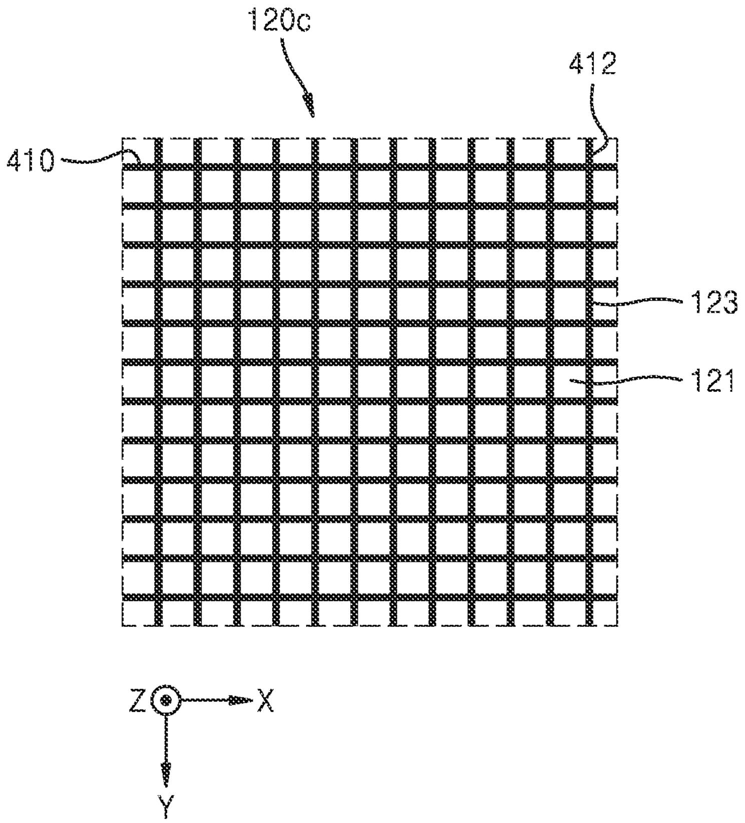
Figure 5C:
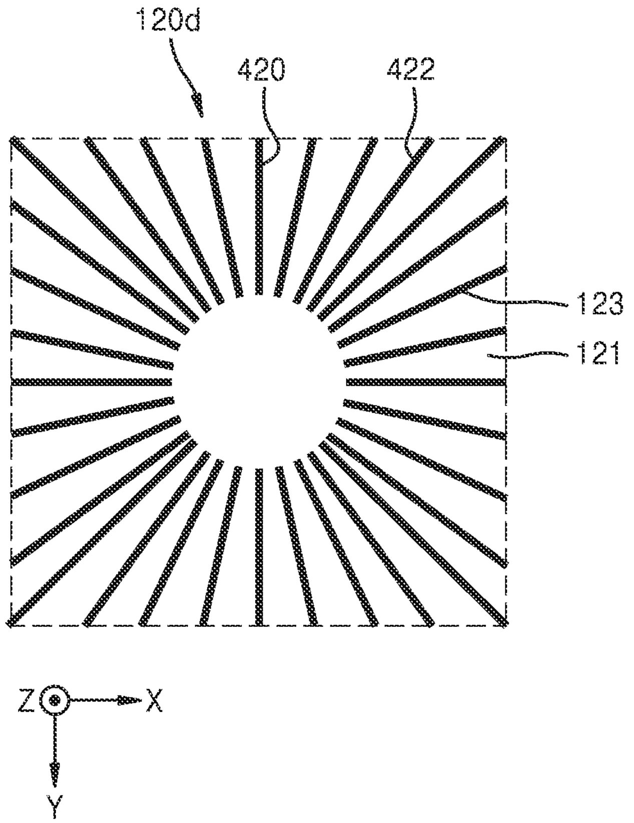

FIGS. 5A, 5B and 5C are diagrams illustrating polishing pads 120*b*, 120*c*, and 120*d*, respectively, according to example embodiments.

Referring to FIG. 5A together with FIG. 1, each of the plurality of segments (such as segments 400 and 402) of the thermal conductive body 123 may be circular, and the plurality of segments may be spaced apart from each other. For example, the plurality of segments of the thermal conductive body 123 may be arranged in a concentric structure. Since the planar shape of the trench 125 of the pad body 121 corresponds to the planar shape of the thermal conductive body 123, the trench 125 of the pad body 121 may also include a plurality of segments arranged in a concentric structure. Two neighboring segments of a plurality of segments of the lower pad body 1211 may be spaced apart from each other by any one of a plurality of segments of the thermal conductive body 123.

Referring to FIG. 5B together with FIG. 1, the plurality of segments of the thermal conductive body 123 may include first segments 410 extending in a first horizontal direction (e.g., the X direction) parallel to the upper surface 111TS of the polishing platen 111 and second segments 412 extending in a second horizontal direction (e.g., the Y direction) parallel to the upper surface 111TS of the polishing platen 111 and crossing the first horizontal direction. The first segments 410 of the thermal conductive body 123 may each linearly extend, and the second segments 412 of the thermal conductive body 123 may each linearly extend. Since the planar shape of the trench 125 of the pad body 121 corresponds to the planar shape of the thermal conductive body 123, the trench 125 of the pad body 121 may also include segments extending in the first horizontal direction and segments extending in the second horizontal direction. Two adjacent segments among the plurality of segments of the lower pad body 1211 may be spaced apart from each other by the thermal conductive body 123.

Referring to FIG. 5C together with FIG. 1, the plurality of segments (such as segments 420 and 422) of the thermal conductive body 123 may extend in a radial direction of the polishing pad 120*d*, respectively. Since the planar shape of the trench 125 of the pad body 121 corresponds to the planar shape of the thermal conductive body 123, the trench 125 of the pad body 121 may also include segments extending in the radial direction of the polishing pad 120*d*.

Figure 6A:
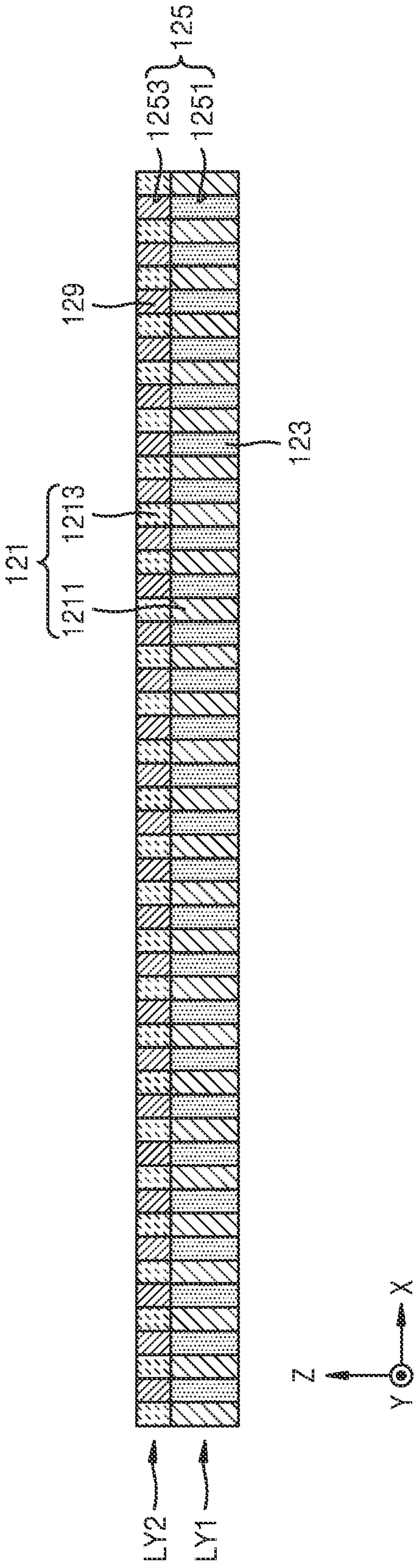
FIGS. 6A and 6B are cross-sectional views illustrating a method of manufacturing a polishing pad, according to example embodiments.
Figure 6B:
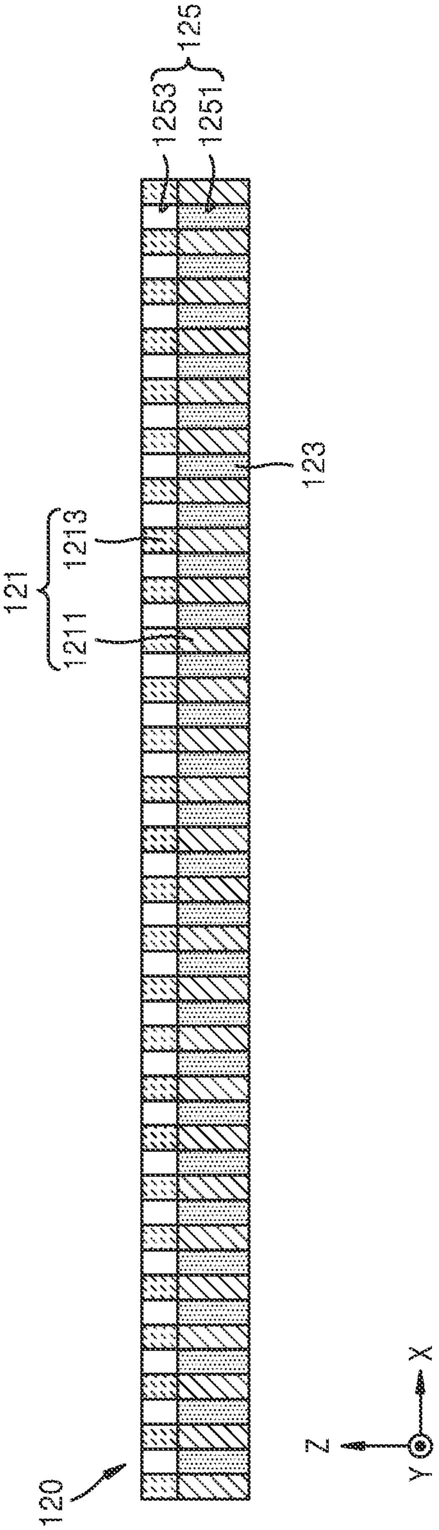

FIGS. 6A and 6B are cross-sectional views illustrating a method of manufacturing a polishing pad 120, according to example embodiments.

Referring to FIG. 6A, a first layer LY1 including a lower pad body 1211 and a thermal conductive body 123 may be formed, and a second layer LY2 including an upper pad body 1213 and a sacrificial body 129 may be formed. For example, the lower surface of the thermal conductive body 123 may be coplanar with the lower surface of the lower pad body 1211, and the upper surface of the thermal conductive body 123 may be coplanar with the upper surface of the lower pad body 1211. The thermal conductive body 123 may be exposed through the lower surface of the lower pad body 1211. The upper pad body 1213 may contact the upper surface of the lower pad body 1211, and may vertically overlap the lower pad body 1211. The sacrificial body 129 may contact the upper surface of the thermal conductive body 123 and may vertically overlap the thermal conductive body 123. For example, after the first layer LY1 is formed by a 3D printing method, the second layer LY2 may be formed by the 3D printing method.

Referring to FIGS. 6A and 6B, after the first layer LY1 and the second layer LY2 are formed, the sacrificial body 129 may be removed. As the sacrificial body 129 is removed, the upper surface of the thermal conductive body 123 may be exposed.

Figure 7:
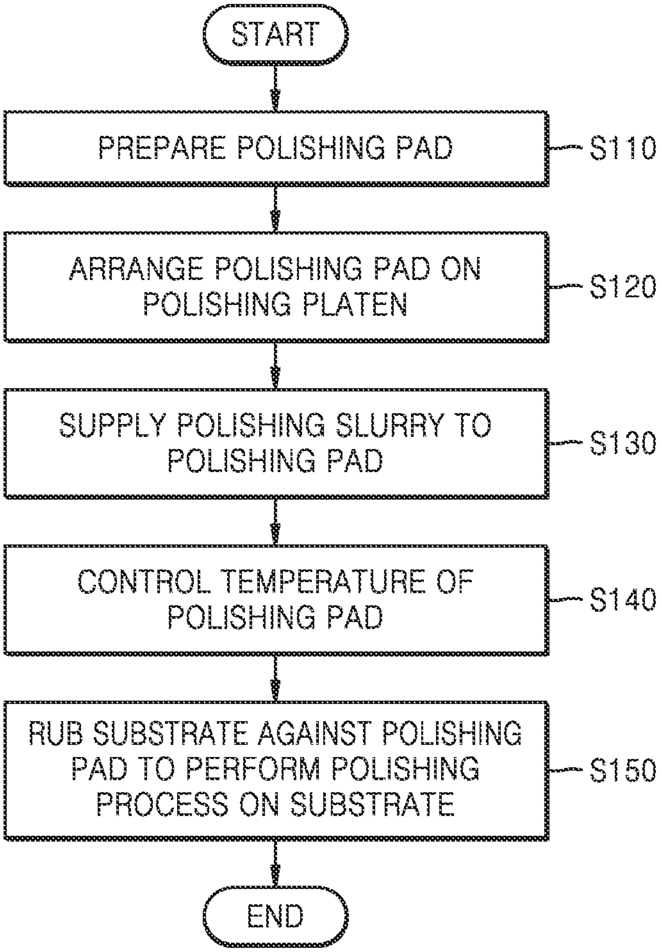
FIG. 7 is a flowchart illustrating a substrate processing method according to example embodiments.

FIG. 7 is a flowchart illustrating a substrate processing method according to example embodiments.

Hereinafter, a substrate treatment method using the substrate treatment apparatus 10 of FIG. 1, and more particularly, a chemical mechanical polishing method for a substrate WF is described with reference to FIGS. 1 and 7.

In operation S110, a polishing pad 120 may be prepared. The preparing of the polishing pad 120 may include the manufacturing of the polishing pad 120 according to the manufacturing method of the polishing pad 120 described with reference to FIGS. 6A and 6B.

In operation S120, the prepared polishing pad 120 may be arranged on the polishing platen 111. The polishing pad 120 may be arranged to cover the upper surface 111TS of the polishing platen 111, and the thermal conductive body 123 may contact the upper surface 111TS of the polishing platen 111.

In operation S130, after the polishing pad 120 is arranged on the polishing platen 111, the polishing slurry SL may be supplied to the polishing pad 120.

In operation S140, the temperature of the polishing pad 120 may be controlled. The controlling of the temperature of the polishing pad 120 may include heating the polishing pad 120 and cooling the polishing pad 120. The controlling of the temperature of the polishing pad 120 may include controlling the temperature of the polishing platen 111 by supplying the temperature control fluid to the fluid channel 111CH of the polishing platen 111 and supplying the temperature control medium TM to the polishing pad 120.

In operation S150, the substrate WF mounted on the polishing head 131 may be rubbed against the polishing pad 120 to perform a polishing process on the substrate WF. The polishing head 131 may press the substrate WF such that the substrate WF contacts the polishing pad 120 at an appropriate pressure, and may rotate the substrate WF relative to the polishing pad 120. The surface of the substrate WF rubbed against with the polishing pad 120 may be polished flat.

According to the substrate processing method of example embodiments, since the polishing pad 120 includes a thermal conductive body 123 to improve thermal coupling between the polishing pad 120 and the polishing platen 111, temperature control of the polishing pad 120 through temperature control of the polishing platen 111 may be achieved more quickly and effectively. Since temperature control of the polishing pad 120 may be implemented more quickly and effectively, the efficiency and reliability of the polishing process on the substrate WF may be improved.

The substrate processing method according to example embodiments may include a method of manufacturing a semiconductor device. For example, the substrate processing method may constitute at least a part of the method of manufacturing a semiconductor device.

FIGS. 8A, 8B, 8C and 8D are cross-sectional views illustrating a method of manufacturing a semiconductor device, according to example embodiments of the disclosure. Hereinafter, a method of manufacturing a semiconductor device, according to example embodiments, is described with reference to FIGS. 8A to 8D.

Figure 8A:
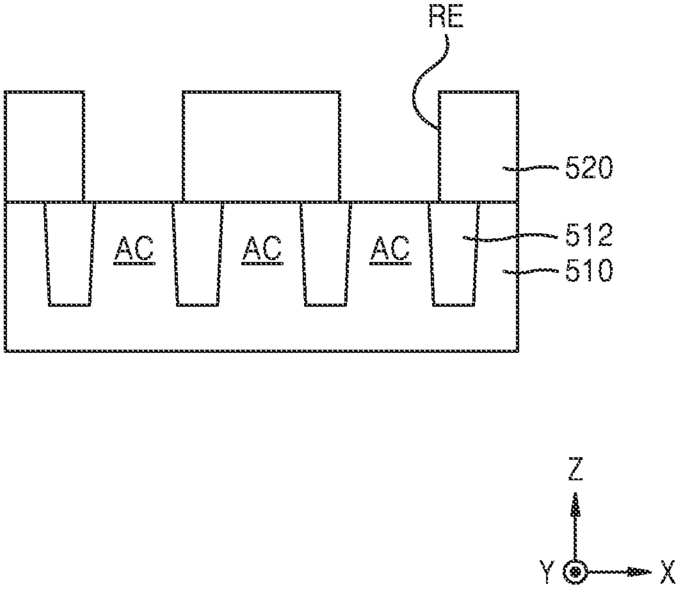
FIGS. 8A, 8B, 8C and 8D are cross-sectional views illustrating a method of manufacturing a semiconductor device, according to example embodiments.

Referring to FIG. 8A, an interlayer insulating layer 520 patterned to at least partially expose a plurality of active regions AC may be formed on a substrate 510 including the plurality of active regions AC. The interlayer insulating layer 520 may include a recess portion RE exposing the active region AC. The recess portion RE may be a contact hole.

The substrate 510 may include a semiconductor, such as Si or Ge, or a compound semiconductor, such as SiGe, SiC, GaAs, InAs, or InP. The substrate 510 may have a silicon on insulator (SDI) structure. The substrate 510 may include a conductive region, for example, an impurity-doped well, or an impurity-doped structure. The plurality of active regions AC may be defined by a plurality of device isolation regions 512 formed on the substrate 510. The device isolation regions 512 may be formed of silicon oxide, silicon nitride, silicon oxynitride, or a combination thereof. The interlayer insulating layer 520 may include silicon oxide.

Figure 8B:
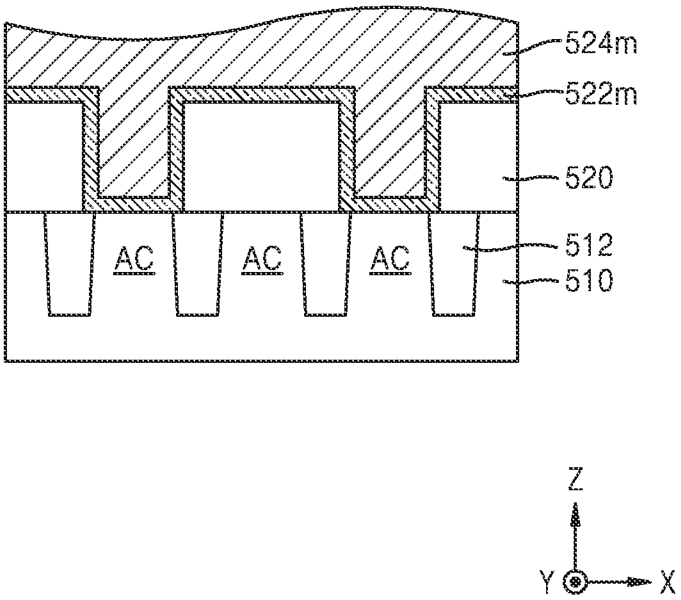

Referring to FIG. 8B, a barrier metal material layer 522*m* is formed in the inside of the recess portion RE and the entire upper surface of the interlayer insulating layer 520. The barrier metal material layer 522*m* may be formed by atomic layer deposition (ALD), chemical vapor deposition (CVD), or physical vapor deposition (PVD). The barrier metal material layer 522*m* may be formed of, for example, Ti and/or TiN.

A conductive material layer 524*m* may be formed on the entire upper surface of the barrier metal material layer 522*m*. The conductive material layer 524*m* may be formed of tungsten (W), for example, by CVD.

Figure 8C:
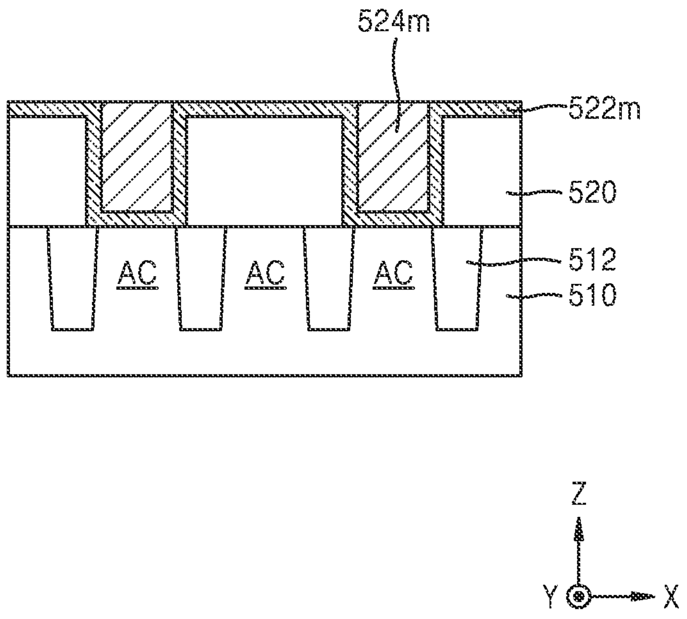

Referring to FIG. 8C, a chemical mechanical polishing (CMP) process may be performed on the conductive material layer 524*m* to limit the conductive material layer 524*m* to the inside of the recess portion RE. In this case, the barrier metal material layer 522 may be used as a polishing stop layer. A flat surface may be obtained from the upper side of the substrate 510 by the CMP process.

Figure 8D:
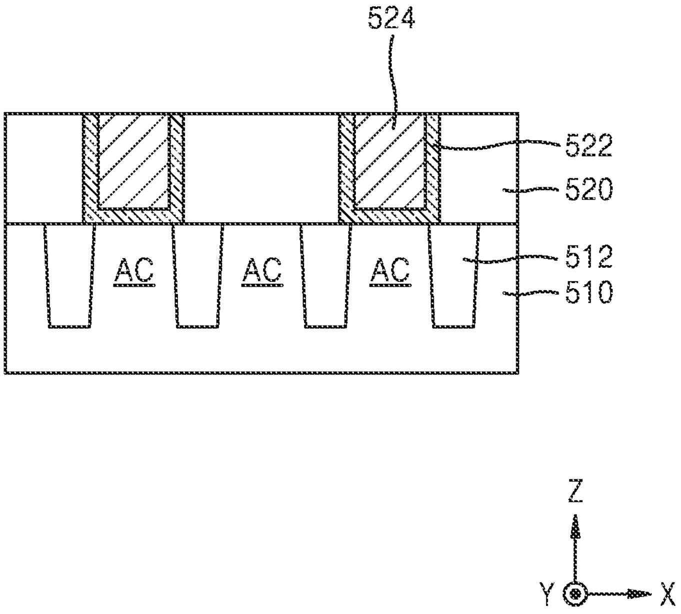

Referring to FIGS. 8C and 8D, a CMP process may be performed on the exposed barrier metal material layer 522*m*, thereby limiting a barrier metal material layer 522 in each contact hole and performing complete node separation between the contact holes.

In FIGS. 8C and 8D, a two-stage CMP process using the barrier metal material layer 522*m* and the interlayer insulating layer 520 as the polishing stop layer, respectively, has been performed. However, in example embodiments, a single CMP process may be performed by using only the interlayer insulating layer 520 as a polishing stop layer. The plurality of conductive regions 524 may be connected to one terminal of a switching device (not shown), such as a field effect transistor formed on the substrate 510. The plurality of conductive regions 524 may be formed of polysilicon, a metal, a conductive metal nitride, a metal silicide, or a combination thereof, but are not limited thereto. The CMP process described with reference to FIGS. 8C and 8D may be performed using the substrate processing apparatus according to example embodiments. For example, the CMP process described with reference to FIGS. 8C and 8D may be performed through the substrate processing method described with reference to FIG. 7.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A substrate processing apparatus comprising:
a polishing platen comprising a fluid channel;
a polishing pad provided on a first surface of the polishing platen, the polishing pad comprising:
a pad body including a trench, the trench penetrating an upper surface and a lower surface of the pad body; and
a thermal conductive body provided in the trench of the pad body and directly contacting the first surface of the polishing platen on which the polishing pad is provided; and
a polishing head provided on the polishing pad and configured to support a substrate,
wherein each of the lower surface of the pad body and a lower surface of the thermal conductive body is directly contacting the first surface of the polishing platen,
wherein the pad body comprises a lower pad body on the polishing platen and an upper pad body on the lower pad body,
wherein the trench comprises an upper portion defined by a sidewall of the upper pad body and a lower portion defined by a sidewall of the lower pad body,
wherein the thermal conductive body is provided in the lower pad body, and
wherein the upper portion of the trench is provided as an empty space.

2. The substrate processing apparatus of claim 1, wherein the trench of the pad body extends from the upper surface of the pad body to a lower surface of the polishing pad such that the trench contacts the first surface of the polishing platen, and wherein the thermal conductive body partially fills the trench of the pad body.

3. The substrate processing apparatus of claim 1, wherein a hardness of the lower pad body is greater than a hardness of the upper pad body.

4. The substrate processing apparatus of claim 3, wherein an upper surface of the lower pad body is coplanar with an upper surface of the thermal conductive body.

5. The substrate processing apparatus of claim 3, wherein the upper pad body at least partially vertically overlaps the lower pad body, and wherein the upper pad body does not vertically overlap the thermal conductive body.

6. The substrate processing apparatus of claim 1, wherein the lower pad body comprises first pores, wherein the upper pad body comprises second pores, and wherein a density of the first pores of the lower pad body is less than a density of the second pores of the upper pad body.

7. The substrate processing apparatus of claim 1, wherein the thermal conductive body comprises a plurality of segments spaced apart from each other, wherein each of the plurality of segments of the thermal conductive body has a width between about 50 μm and about 150 μm, and wherein an interval between at least two neighboring segments of the plurality of segments of the thermal conductive body is between about 100 μm and about 200 μm.

8. The substrate processing apparatus of claim 1, wherein the thermal conductive body comprises a plurality of segments provided in a concentric structure.

9. The substrate processing apparatus of claim 1, wherein the thermal conductive body comprises:

first segments extending in a first direction that is parallel to the first surface of the polishing platen; and second segments extending in a second direction that is parallel to the first surface of the polishing platen and that crosses the first direction.

10. The substrate processing apparatus of claim 1, wherein the thermal conductive body comprises a plurality of segments extending in a radial direction of the polishing pad.

11. The substrate processing apparatus of claim 1, wherein the thermal conductive body comprises a base comprising a polymer and a thermally conductive particle contained in the base.

12. The substrate processing apparatus of claim 1, further comprising a polishing slurry supply apparatus comprising a polishing slurry supply nozzle configured to supply polishing slurry to the polishing pad, wherein the upper portion of the trench of the pad body is configured to accommodate the polishing slurry.

13. The substrate processing apparatus of claim 1, further comprising a medium supply device comprising a medium supply nozzle configured to supply a temperature control medium to the polishing pad, wherein an upper part of the trench of the pad body is configured to accommodate the temperature control medium.

14. The substrate processing apparatus of claim 1, wherein a width of a lower portion of the thermal conductive body is greater than a width of an upper portion of the thermal conductive body, wherein the lower portion of the thermal conductive body and the upper portion of the thermal conductive body are within the trench.

15. A polishing pad comprising:

a pad body comprising:

a lower pad body having a first lower surface and a first upper surface;

an upper pad body on the lower pad body, the upper pad body having a second lower surface and a second upper surface; and a trench penetrating the first lower surface of the lower pad body, the first upper surface of the lower pad body, the second lower surface of the upper pad body, and the second upper surface of the upper pad body; and a thermal conductive body provided in the trench of the pad body and exposed through the first lower surface of the lower pad body, wherein each of a lower surface of the thermal conductive body and the first lower surface of the lower pad body is directly contacting a surface of a polishing platen, wherein a hardness of the lower pad body is greater than a hardness of the upper pad body, wherein the trench comprises an upper portion defined by a sidewall of the upper pad body and a lower portion defined by a sidewall of the lower pad body, wherein the thermal conductive body is provided in the lower pad body, and wherein the upper portion of the trench is provided as an empty space.

16. The polishing pad of claim 15, wherein an upper surface of the thermal conductive body is coplanar with the first upper surface of the lower pad body, and wherein the lower surface of the thermal conductive body is coplanar with the first lower surface of the lower pad body.

17. The polishing pad of claim 15, wherein the thermal conductive body comprises a first plurality of segments spaced apart from each other, and wherein the lower pad body comprises a second plurality of segments spaced apart from each other by the thermal conductive body.

18. A substrate processing apparatus comprising:

a polishing platen comprising a fluid channel;

a polishing pad provided on a first surface of the polishing platen, the polishing pad comprising:

a pad body including a lower pad body on the polishing platen and an upper pad body on the lower pad body, the pad body having a trench, and the trench penetrating a first lower surface of the lower pad body, a first upper surface of the lower pad body, a second lower surface of the upper pad body, and a second upper surface of the upper pad body; and a thermal conductive body provided in the trench of the pad body; and a polishing head provided on the polishing pad and configured to support a substrate, wherein a lower surface of the thermal conductive body is exposed through the first lower surface of the lower pad body, wherein each of the lower surface of the thermal conductive body and the first lower surface of the lower pad body is directly contacting the first surface of the polishing platen, wherein a hardness of the lower pad body is greater than a hardness of the upper pad body, wherein the trench comprises an upper portion defined by a sidewall of the upper pad body and a lower portion defined by a sidewall of the lower pad body, wherein the thermal conductive body is provided in the lower portion of the trench, and wherein the upper portion of the trench is provided as an empty space.

* * * * *